United States Patent
Kim et al.

(10) Patent No.: US 9,432,004 B2
(45) Date of Patent: Aug. 30, 2016

(54) AUTOMATIC GAIN AND OFFSET COMPENSATION FOR AN ELECTRONIC CIRCUIT

(71) Applicant: STMicroelectronics, Inc., Coppell, TX (US)

(72) Inventors: Felix Kim, Plano, TX (US); Mark A. Lysinger, Carrollton, TX (US); Scott V. Ho, Plano, TX (US)

(73) Assignee: STMICROELECTRONICS, INC., Coppell, TX (US)

( * ) Notice: Subject to any disclaimer, the term of this patent is extended or adjusted under 35 U.S.C. 154(b) by 149 days.

(21) Appl. No.: 14/255,400

(22) Filed: Apr. 17, 2014

(65) Prior Publication Data

US 2015/0303903 A1    Oct. 22, 2015

(51) Int. Cl.
*H03L 5/00* (2006.01)
*H03K 5/003* (2006.01)

(52) U.S. Cl.
CPC .................... *H03K 5/003* (2013.01)

(58) Field of Classification Search
CPC ..................................... H03K 5/003
USPC ........................................ 327/307
See application file for complete search history.

(56) References Cited

U.S. PATENT DOCUMENTS

| | | | |
|---|---|---|---|
| 3,988,689 A * | 10/1976 | Ochi et al. ................... 330/9 |
| 5,798,664 A * | 8/1998 | Nagahori et al. ........... 327/307 |
| 7,034,608 B2 * | 4/2006 | Gai et al. ..................... 330/9 |
| 2004/0094368 A1 * | 5/2004 | Birbaumer .................. 187/394 |
| 2009/0096528 A1 * | 4/2009 | Nakai et al. ................ 330/278 |
| 2011/0181361 A1 * | 7/2011 | Nolan et al. ............... 330/278 |
| 2013/0021181 A1 * | 1/2013 | Shah ............................ 341/110 |
| 2014/0021886 A1 * | 1/2014 | Kurosawa et al. ......... 318/135 |

\* cited by examiner

*Primary Examiner* — Ryan Jager
(74) *Attorney, Agent, or Firm* — Gardere Wynne Sewell LLP

(57) ABSTRACT

Gain offset and voltage offset compensation for a controllable gain element of a circuit is effected in response to a gain offset value and voltage offset value. A current operating condition of the circuit is sensed and compared to a nominal operating condition. If the current operating condition is outside the nominal operating condition by more than a threshold, a calibration operation to set the gain and voltage offset values is performed. The gain offset value is selected as a function of the sensed current operating condition. With respect to the voltage offset, differential input terminals of the controllable gain element are shunted and the output is measured. The measured output value of the controllable gain element is applied as the voltage offset value. The operating conditions at issue may be one or more of supply voltage and temperature.

13 Claims, 3 Drawing Sheets

AUTOMATIC GAIN AND OFFSET COMPENSATION FOR AN ELECTRONIC CIRCUIT

FIELD OF THE INVENTION

The present disclosure generally relates to electronic circuits (for example, of the type performing signal amplification and conversion operations) and, in particular, to the performance of gain and offset compensation with respect to such electronic circuits.

BACKGROUND

Reference is made to FIG. 1 which illustrates a block diagram of a conventional electronic circuit 10 configured to implement gain and offset compensation. The circuit 10 may, for example, receive an input signal (In) and generate an output signal (Out). The circuit 10 is powered from a power supply coupled to a first power supply node 12 and second power supply node 14. In an embodiment, the power supply may be configured to supply a Vdd supply voltage to node 12 and a ground supply voltage to node 14. The circuit 10 may comprise any type of electronic circuit or component which performs a signal amplification operation. Examples of such circuits include, without limitation, signal amplifiers, converters (such as analog-to-digital), and the like, which may include digital circuitry, analog circuitry and mixed analog-digital circuitry.

Those skilled in the art understand that the electronic circuit 10 and, more particularly, the circuit components thereof, do not exhibit an ideal operation. Indeed, voltage gain and voltage offset errors are often present. To account for this fact, the circuit designer includes compensation circuitry. At a nominal supply voltage condition and a nominal temperature environment condition, the compensation circuitry is designed to compensate for first order systematic errors in gain and voltage. For example, gain compensation can be provided to adjust the operation of a controllable gain element 22 within the circuit 10 by specifying a gain error (referred to as "Gf"). Additionally, voltage compensation can be provided adjust the operation of the controllable gain element 22 within the circuit 10 by specifying a voltage offset error (referred to as "Of").

The controllable gain element 22 receives an input signal (Ir) that may, for example, be derived from the signal In, and generates an output signal (Ic) that may, for example, be used to derive the output signal Out. From a schematic perspective, the controllable gain element 22 includes a gain device 30 and a summing device 32 (implemented in the digital domain, analog domain, or mixed signal domain). A gain error circuit 20 stores the gain error (Gf) which is applied to the gain device 30 to specify a gain applied to the input signal Ir. An offset error circuit 24 stores the voltage offset error (Of) which is applied to the summing device 32 to specify a voltage offset applied to the gain adjusted signal generated by the gain device 30. This compensation operation implemented in connection with operation of the controllable gain element 22 may be mathematically represented by the following formula: $Ic=(Ir*Gf)+Of$.

Those skilled in the art understand that the error circuits 20 and 24 can be structurally implemented in a number of different ways. In one embodiment, trim circuitry is provided which generates output signals specifying the values of each error. In another embodiment, programmable registers are provided which generate output signals specifying the values of each error. In either case, the controllable gain element 22 is operable responsive to the generated error output signals to effectuate first order error compensation relative to the nominal supply voltage condition and the nominal temperature environment condition.

The foregoing compensation technique is well suited to address first order systematic errors at nominal operating conditions. As the supply voltage and environmental temperature change in the course of circuit 10 operation, those skilled in the art understand that second order errors arise which are not addressed and corrected by the error circuits 20 and 24. These second order errors may go uncorrected in prior art circuitry.

There is accordingly a need in the art to provide for automated gain and offset compensation which accounts for variation in supply voltage and environmental temperature during circuit operation.

SUMMARY

In an embodiment, a circuit comprises: a controllable gain element having a differential input and an output and which is operable to effect gain offset and voltage offset compensation in response to a gain offset value and voltage offset value; a differential shunt circuit coupled to the differential input of the controllable gain element; a sensing circuit configured to sense a current operating condition of said circuit; and a control circuit operable responsive to said sensed current operating condition to: detect that the current operating condition of the circuit is outside a nominal operating condition; apply as said gain offset value a value selected as a function of the sensed current operating condition; actuate the differential shunt to connect terminals of the differential input to each other; sense a value at the output of the controllable gain element; and apply the sensed value as said voltage offset value.

In an embodiment, a method comprises: effecting gain offset and voltage offset compensation for a controllable gain element having a differential input and an output in response to a gain offset value and voltage offset value; sensing a current operating condition; detecting that the current operating condition is outside a nominal operating condition; applying as said gain offset value a value selected as a function of the sensed current operating condition; shunting terminals of the differential input to each other; sensing a value at the output of the controllable gain element; and applying the sensed value as said voltage offset value.

In an embodiment, a circuit comprises: a controllable gain element having an input and an output and which is operable to effect gain offset compensation in response to a gain offset value; a sensing circuit configured to sense a current operating condition of said circuit; and a control circuit operable responsive to said sensed current operating condition to: detect that the current operating condition of the circuit is outside a nominal operating condition; and apply as said gain offset value a value selected as a function of the sensed current operating condition.

In an embodiment, a method comprises: effecting gain offset compensation for a controllable gain element having an input and an output in response to a gain offset value; sensing a current operating condition; detecting that the current operating condition is outside a nominal operating condition; and applying as said gain offset value a value selected as a function of the sensed current operating condition.

In an embodiment, a circuit comprises: a controllable gain element having a differential input and an output and which is operable to effect voltage offset compensation in response to a voltage offset value; a differential shunt circuit coupled to the differential input of the controllable gain element; a sensing circuit configured to sense a current operating condition of said circuit; and a control circuit operable responsive to said sensed current operating condition to: detect that the current operating condition of the circuit is outside a nominal operating condition; actuate the differential shunt to connect terminals of the differential input to each other; sense a value at the output of the controllable gain element; and apply the sensed value as said voltage offset value.

In an embodiment, a method comprises: effecting voltage offset compensation for a controllable gain element having a differential input and an output in response to a voltage offset value; sensing a current operating condition; detecting that the current operating condition is outside a nominal operating condition; shunting terminals of the differential input to each other; sensing a value at the output of the controllable gain element; and applying the sensed value as said voltage offset value.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE DRAWINGS

Figure 1:
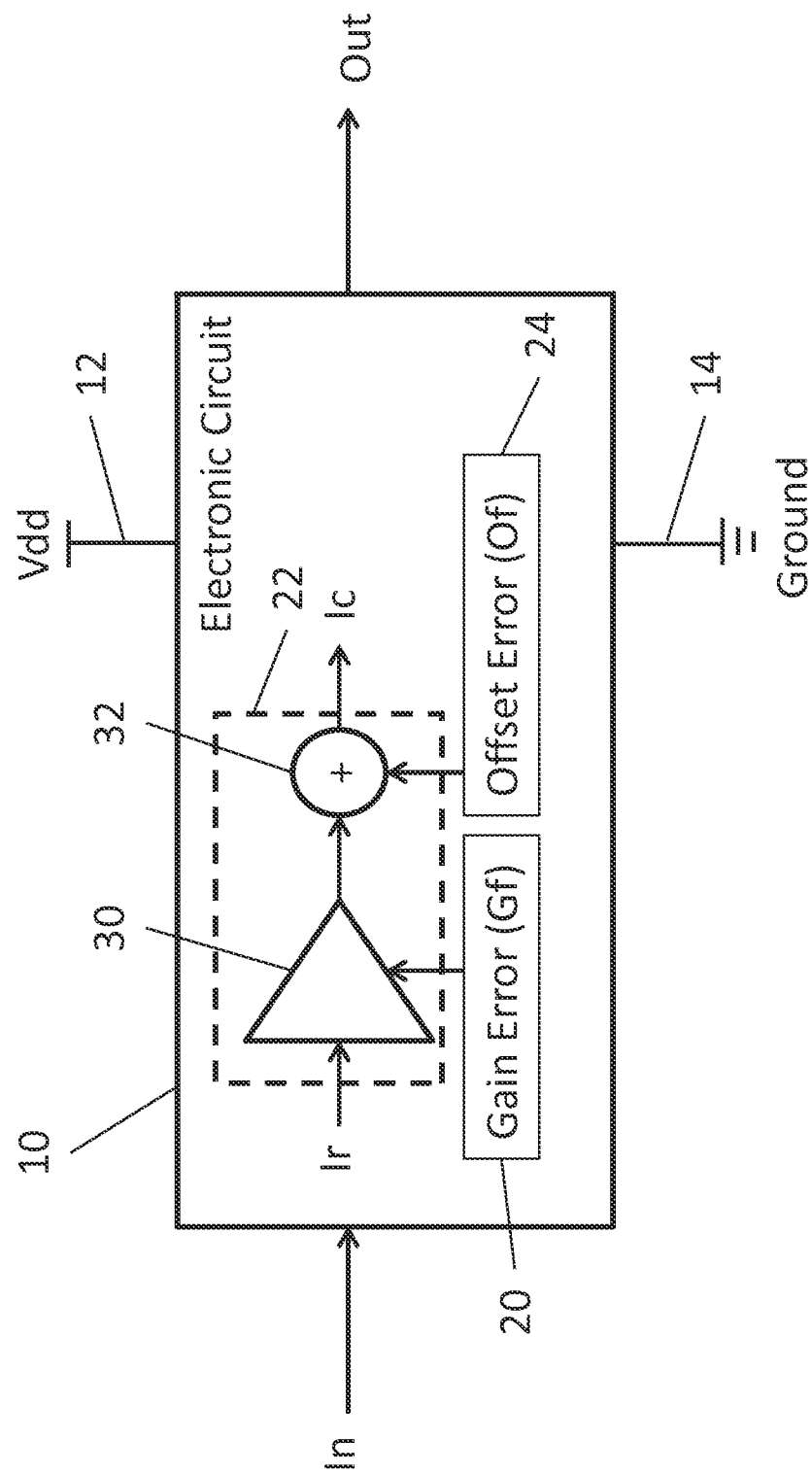
FIG. 1 is a block diagram of conventional electronic circuit configured to implement gain and offset compensation.
Figure 2:
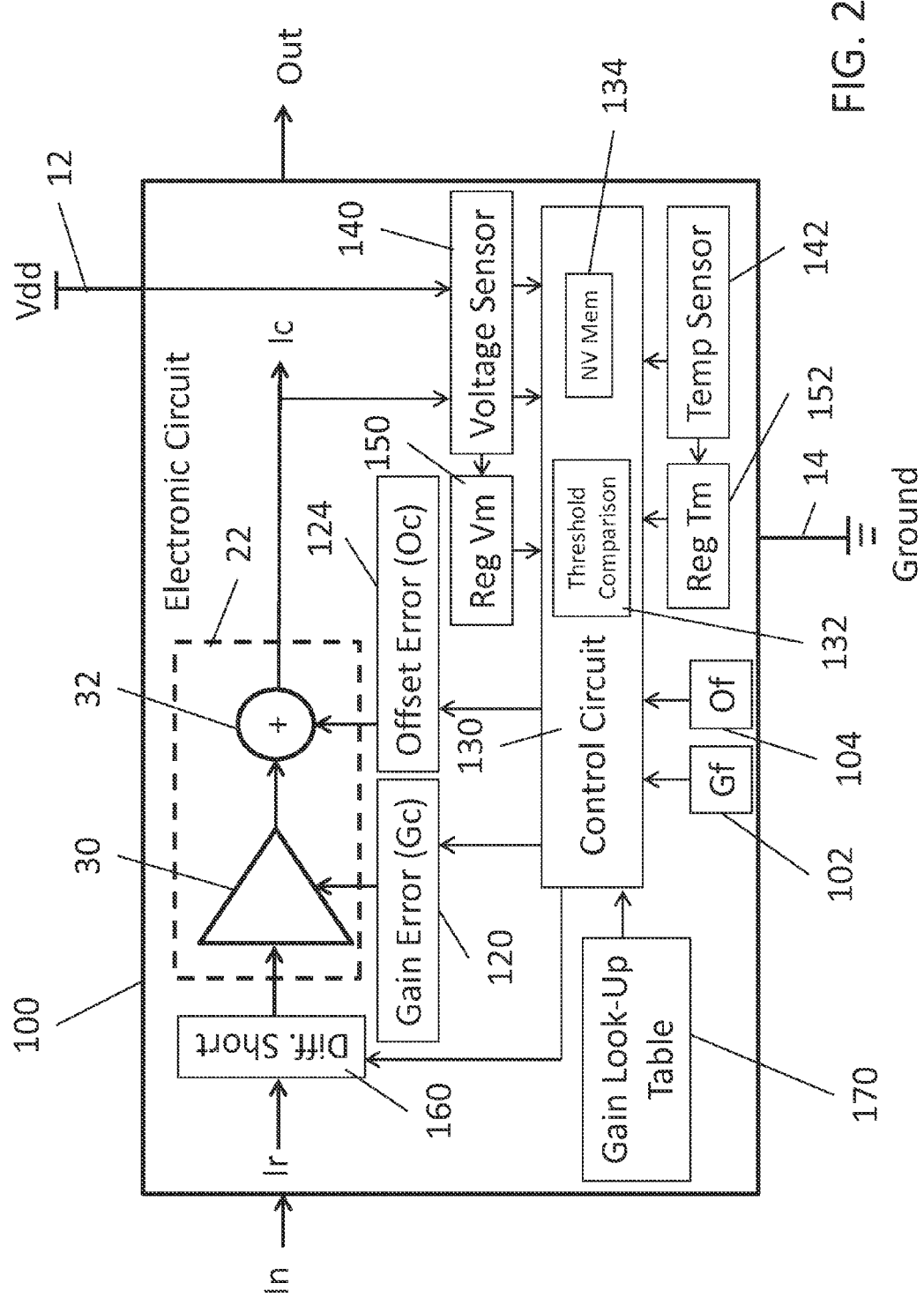
FIG. 2 a block diagram of an electronic circuit configured to implement automatic gain and offset compensation.

Reference is now made FIG. 2 which illustrates a block diagram of an electronic circuit 100 configured to implement automatic gain and offset compensation. Same references in FIGS. 1 and 2 refer to same or similar components.

The circuit 100 includes a first register 102 storing a fixed (for example, factory set) gain error (Gf) value and a second register 104 storing a fixed (for example, factor set) offset error (Of) value. The gain and offset errors correspond generally to the gain and offset errors for the circuit 10 implementation of FIG. 1. Thus, these errors represent compensation for first order systematic errors at a nominal supply voltage condition and a nominal temperature environment condition.

The circuit 100 supports gain compensation by adjusting the operation of the controllable gain element 22 within the circuit 100 through a specified gain error (Gc) provided by a gain error circuit 120. Additionally, voltage compensation is supported by adjusting the operation of the controllable gain element 22 within the circuit 100 through a specified voltage offset error (Oc) provided by a voltage offset circuit 124.

The controllable gain element 22 receives an input signal (Ir) that may, for example, be derived from the signal In, and generates an output signal (Ic) that may, for example, be used to derive the output signal Out. From a schematic perspective, the controllable gain element 22 may be represented by a gain device 30 and a summing device 32. The gain error circuit 120 applies the gain error (Gc) to the gain device 30 to specify a gain applied to the input signal Ir. The offset error circuit 124 applies the offset error (Oc) to the summing device 32 to specify a voltage offset applied to the gain adjusted signal generated by the gain device 30. This compensation operation may be mathematically represented by the following formula: Ic=(Ir*Gc)+Oc.

In a preferred embodiment, the error circuits 120 and 124 are structurally implemented using programmable registers which generate output signals specifying the values of each error. The controllable gain element 22 is operable response to the generated error output signals to effectuate error compensation.

The circuit 100 further includes a control circuit 130 which may be implemented, for example, as a logic circuit, microcontroller or a processing circuit. The circuit 100 initially functions (for example, at start-up, turn-on or compensation actuation of the circuit 100) to read the fixed gain error (Gf) value from the first register 102 and read the fixed offset error (Of) value from the second register 104. These fixed error values are then loaded by the control circuit 130 respectively into the gain error circuit 120 (thus providing Gc=Gf) and the offset error circuit 124 (thus providing Oc=Of). At this point, the circuit 100 of FIG. 2 is configured for operation in the manner described above with respect to FIG. 1 to compensate for first order errors at the nominal supply voltage condition and the nominal temperature environment condition.

The circuit 100 of FIG. 2 further supports an automatic compensation operating mode designed to address and compensate for second order errors which arise due to change in supply voltage and environmental temperature during the course of circuit 100 operation. When the change in condition exceeds a threshold level, the circuit 100 enters a recalibration mode of operation to update the values for gain error Gc and offset error Oc provided by the error circuits 120 and 124.

A voltage sensing circuit 140 includes sense circuitry coupled to sense the supply voltage Vdd at the first power supply node 12 and generate an output signal Vp indicative of the sensed present voltage. The sensed present voltage (output signal Vp) is supplied to the control circuit 130 and is further periodically stored in a storage circuit (such as a voltage register circuit Reg Vm) 150 as the previously measured voltage (Vm). In an embodiment, the circuit 140 or the circuit 130 includes an analog-to-digital conversion circuit to provide the present voltage value as a digital signal.

A temperature sensing circuit 142 is configured to sense the temperature of the circuit 100 and generate an output signal Tp indicative of the sensed present temperature. The sensed present voltage (output signal Tp) is supplied to the control circuit 130 and is further periodically stored in a storage circuit (such as temperature register circuit Reg Tm) 152 as the previously measured temperature (Tm). In an embodiment, the circuit 140 or the circuit 130 includes an analog-to-digital conversion circuit to provide the present temperature value as a digital signal.

The control circuit 130 further includes a threshold comparator 132 that is operable to perform threshold comparison operations as to both voltage and temperature.

With respect to the voltage threshold comparison, the threshold comparator 132 operates to compare the sensed present voltage (output signal Vp) provided by voltage sensing circuit 140 against the previously measured voltage (Vm) provided by the voltage register circuit (Reg Vm) 150. This comparison produces a result indicative of a change in voltage ($\Delta V$) at the supply node 12 over a given time period (associated with the rate of periodic storage in the voltage register circuit (Reg Vm) 150). If the change in voltage ($\Delta V$) over that time period exceeds a voltage threshold (Vt), this indicates that a recalibration of the compensation for circuit 100 is needed. The voltage threshold (Vt) may, for example, be stored in a non-volatile memory 134. In the event of recalibration triggering, sensed present voltage Vp replaces the value of the previously measured voltage Vm.

With respect to the temperature threshold comparison, the threshold comparator 132 operates to compare the sensed present temperature (output signal Tp) provided by temperature sensing circuit 142 against the previously measured temperature (Tm) provided by the temperature register circuit (Reg Tm) 152. This comparison produces a result indicative of a change in temperature ($\Delta T$) in the circuit 100 over a given time period (associated with the rate of periodic storage in the temperature register circuit (Reg Tm) 152). If the change in temperature ($\Delta T$) over that time period exceeds a temperature threshold (Tt), this indicates that a recalibration of the compensation for circuit 100 is needed. The temperature threshold (Tt) may, for example, be stored in the non-volatile memory 134. In the event of recalibration triggering, sensed present temperature Tp replaces the value of the previously measured voltage Tm.

In response to the need for compensation recalibration (triggered by either voltage or temperature change in excess of threshold), the control circuit 130 actuates a differential shorting circuit 160 that is coupled between the input signal Ir and the controllable gain element 22. In this context, the input signal Ir is understood to be a differential input signal having two components (a "positive" component and a "negative" component) and the controllable gain element 22 is responsive to the difference between the two components. When not actuated, the shorting circuit 160 simply passes the two components of the differential input signal Ir to the differential (positive and negative) inputs of the controllable gain element 22. When actuated by the control circuit during recalibration, the shorting circuit 160 operates to short the positive and negative inputs of the controllable gain element 22 to each other.

In an ideal device, the result of such a differential input shorting operation would be the generation of a zero output signal (because the difference between the differential inputs is zero). Any non-zero value at the output thus represents a voltage offset error for the circuitry. Indeed, the fixed offset error (Of) is provided to ensure such as zero output at a nominal supply voltage condition and a nominal temperature environment condition. With voltage or temperature change in excess of the threshold, however, the fixed offset error (Of) will be insufficient to compensate and provide the zero output signal when the shorting circuit 160 is actuated.

The voltage sensing circuit 140 further includes sense circuitry coupled to sense the output signal (Ic). The sensing of the output voltage is performed by the voltage sensing circuit 140 when the shorting circuit 160 operates to short the positive and negative inputs of the controllable gain element 22 to each other. The sensed voltage in this condition provides an error signal $\Delta O$ to the control circuit 130. In an embodiment, the circuit 140 or the circuit 130 includes an analog-to-digital conversion circuit to provide the error signal value as a digital signal. The control circuit 130 then adjusts the offset error (Oc) provided by the error circuit 124 in accordance with the sensed error signal $\Delta O$. For example, in an embodiment, the current offset error ($Oc_c$) value would be set equal to the previous offset error ($Oc_p$) value minus the sensed error signal $\Delta O$ (i.e., $Oc_c=Oc_p-\Delta O$).

In an alternative embodiment, the control circuit 130 responds to the need for recalibration (triggered by either voltage or temperature change in excess of threshold) by setting the offset error Oc to zero (i.e., Oc=0) and actuating the differential shorting circuit 160 to short the positive and negative inputs of the controllable gain element 22 to each other. The sense circuitry of the voltage sensing circuit 140 that is coupled to sense the output signal (Ic) generates the error signal $\Delta O$. The control circuit 130 responds to the sensed error signal $\Delta O$ during recalibration by loading the negative of the sensed error signal $\Delta O$ (i.e., $Oc=-\Delta O$) into the offset error circuit 124.

In response to the need for compensation recalibration (triggered by either voltage or temperature change in excess of threshold), the control circuit 130 further obtains a new value for the gain error Gc from a look-up table 170. The look-up table 170 is pre-programmed to store a table correlating gain drift as a function of supply voltage and temperature. The table data may be obtained during factory testing of the circuit 10. The range of supply voltage and temperature for which gain drift has been measured should meet or exceed the expected operating conditions for the device. In addition, the values should be provided for each increment of the voltage threshold (Vt) and temperature threshold (Tt) relative to the nominal supply voltage condition and nominal temperature environment condition. The new value for the gain error Gc that is retrieved by the control circuit 130 from the look-up table 170 is loaded into the gain error circuit 120.

If not previously update at the triggering of recalibration, in conjunction with or at the end of recalibration the sensed present voltage (output signal Vp) provided by voltage sensing circuit 140 is stored in the voltage register circuit (Reg Vm) 150 as the previously measured voltage (Vm), and the sensed present temperature (output signal Tp) provided by temperature sensing circuit 142 is stored in the temperature register circuit (Reg Tm) 152 as the previously measured temperature (Tm). A new cycle for the threshold comparison then begins and the calibration process repeats. In the absence of a triggering of the compensation recalibration process, the current gain error Gc and offset error Oc values are retained by the error circuitry 120 and 124, and no updating of Vm and Tm is performed.

Figure 3:
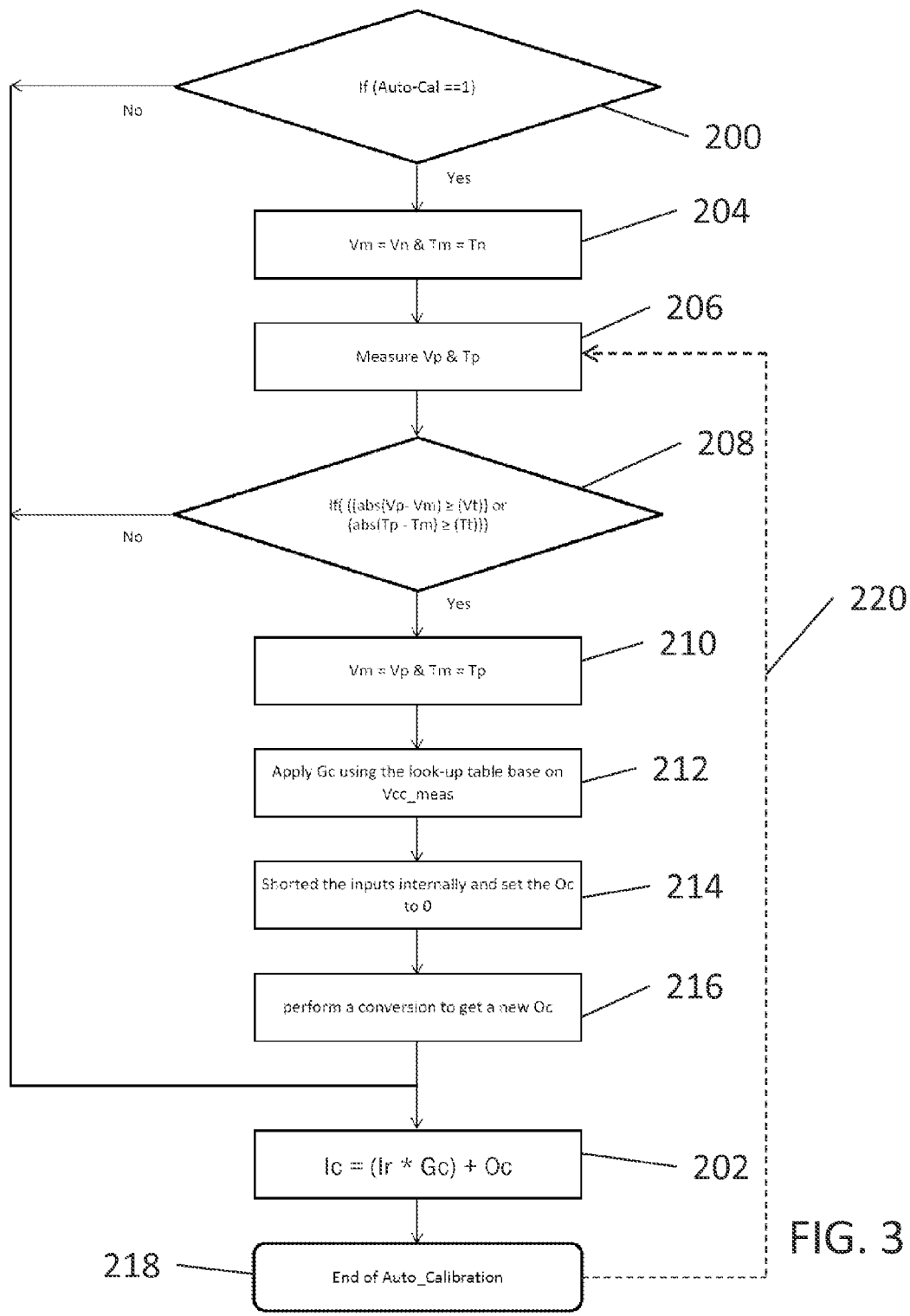
FIG. 3 is a flow diagram for calibration operation of the circuit of FIG. 2.

Reference is now made to FIG. 3 which illustrates a flow diagram for calibration operation of the circuit 100 of FIG. 2. The calibration process of FIG. 3 may be selectively actuated at step 200 by setting a configurable automatic calibration bit (Auto-Cal) provided in the circuit 100 (for example, in association with the control circuit 130). Alternatively, the process may be performed at certain instances. For example, at start-up of the circuit or on a periodic basis.

First order offset and gain compensation values may be factory measured for a nominal supply voltage (Vn) and a nominal operating temperature (Tn). The resulting nominal offset and gain compensation values (Of and Gf) are stored in error circuits 120 and 124. If the automatic compensation recalibration is disabled (Auto-Cal=0 and "no" at step 200), then the values for Of and Gf will be applied during normal operation of the circuit 100 to effectuate compensation in accordance with the expression Ic=(Ir*Gc)+Oc (wherein Gc=Gf and Oc=Of) (see, step 202). The resulting output signal (Ic) should be error free when taken at or about the nominal supply voltage and temperature.

If the automatic compensation recalibration is enabled (Auto-Cal=1 and "yes" at step 200), the nominal offset and gain compensation values (Of and Gf) are initially used in the error circuits 120 and 124 and the voltage register circuit (Reg Vm) 150 and temperature register circuit (Reg Tm) 152 are initialized to the nominal voltage and temperature values (Vn and Tn) in step 204.

The voltage sensing circuit 140 and temperature sensing circuit 142 operate to measure the present supply voltage Vp and present temperature Tp in step 206.

In step 208, a number of threshold comparison operations are performed. A first threshold comparison operation calculates a change in supply voltage (Vp−Vm) for comparison to a voltage threshold Vt. A second threshold comparison operation calculates a change in temperature (Tp−Tm) for comparison to a temperature threshold Tt.

If the absolute value of the change in supply voltage is less than the voltage threshold Vt, AND if the absolute value of the change in temperature is less than the temperature threshold Tt, then recalibration of compensation is not triggered ("no" at step 208). In this case, the current values for Oc and Gc are maintained and will be applied during operation of the circuit 10 to effectuate compensation in accordance with the expression Ic=(Ir*Gc)+Oc (see, step 202).

Conversely, if the absolute value of the change in temperature meets or exceeds the temperature threshold Tt, OR if the absolute value of the change in supply voltage meets or exceeds the voltage threshold Vt, then recalibration of compensation is triggered ("yes" at step 208).

In the recalibration process, the voltage register circuit (Reg Vm) 150 and temperature register circuit (Reg Tm) 152 are loaded with the sensed present voltage and temperature values (Vp and Tp) in step 210. This step could alternatively be performed at the end of recalibration.

For the determination of the gain error Gc, a gain error value is selected as a function of one or more of the sensed present voltage and temperature values (Vp and Tp) in step 212. These gain error values may be stored in a look-up table that is accessed in view of the sensed present voltage and temperature values. As an example, during factory testing of the circuit 22, gain drift can be measured as a function of supply voltage and temperature. Tables of gain error values associated with the measured drift may be stored in a non-volatile memory. The supply voltage and temperature generated gain error values for compensation should correspond to the threshold values Vt and Tt. For example, if the voltage threshold Vt is 0.2V and the temperature threshold Vt is or 5° C., then the look-up table should provide gain error values for each 0.2V or 5° C. incremental change, positive and negative, relative to nominal voltage Vn or nominal temperature Tm. Step 212 further includes applying the selected gain error as the gain error Gc in the gain error circuit 120.

For the determination of the offset error Oc, the differential inputs for the controllable gain element 22 which receives the input signal Ir are shorted together in step 214. Step 214 may further include clearing the offset error Oc in the offset error circuit 124 to zero. In an ideal device, this shorted differential input configuration should result in a zero output from the controllable gain element 22. However, due to the change in voltage or temperature which triggered the recalibration process, the shorted differential input configuration will in actuality produce a non-zero output indicative of some amount of offset drift error. A conversion operation is performed in step 216 to obtain a new voltage offset error Oc. If the output value is non-zero, the negative of the output value is applied as the output error Oc in the offset error circuit 124. If instead the output value is zero, then an output error Oc equal to zero is stored in the offset error circuit 124.

So, if the threshold calculation resulted in performance of the recalibration process, the values for Oc and Gc will be updated in the manner described above. The compensation operation is then performed in step 202 in accordance with the expression Ic=(Ir*Gc)+Oc, wherein Gc and Oc are the updated values.

The calibration process then terminates in step 218. This does not mean that no further calibration is performed. Rather, the process of FIG. 3, in whole or in part, is performed repeatedly while the circuit 100 operates so as to ensure that the calibration is adjusted to account for continued changes in voltage or temperature. This repeated operation is generally indicated by dotted line 220. The rate of repetition is selectable or configurable. Alternatively, the calibration operation may be repeated in response to detection or occurrence of a certain event.

The foregoing process is particularly applicable to non-programmable circuits of the type performing, for example, amplification and data conversion operations. It will be understood that such amplification may instead be programmable and such data conversion could be performed at different resolutions. In such a programmable circuit implementation, each of the programmable options for circuit operation may require a unique set of compensation values associated with the determination of updated Gc and Oc values. The compensation calibration methodology described herein may be programmable in the same way as the circuit. In such a case, voltage offset recalibration is performed at any programmed option and separate values of the offset error Oc may be stored for each option. Likewise, the look-up table for gain error Gc values may include data entry associated with each of the available programmed options.

The illustration of the circuit 100 in FIG. 2 is understood by those skilled in the art to be schematic only. The blocks of the circuit diagram may represent analog circuits, digital circuits or mixed signal circuits.

In a preferred implementation, the calibration functionality is performed in the digital domain, with all analog signals converted to digital signals in corresponding analog-to-digital converter circuitry. By performing the calibration in the digital domain after analog-to-digital conversion, the offset and gain errors from the whole signal chain (both analog gain stage and the analog-to-digital conversion circuitry) are compensated.

In many systems, periodic measurement of supply voltage and current temperature conditions are a part of normal system operation. The calibration operation described herein which is one-shot triggered by threshold comparison is thus both resource efficient and power efficient (for example, in comparison to continuous background calibration methods of the prior art).

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
a controllable gain element having a differential input and an output and operable to effect gain offset and voltage offset compensation in response to a gain offset value and voltage offset value;
a differential shunt circuit coupled to the differential input of the controllable gain element;
a sensing circuit configured to sense a current operating condition of said circuit; and
a control circuit operable responsive to said sensed current operating condition to: detect that the current operating condition of the circuit is outside a nominal operating condition; apply as said gain offset value a value selected as a function of the sensed current operating condition; actuate the differential shunt to connect terminals of the differential input to each other; sense a voltage at the output of the controllable gain element; and apply the sensed voltage as said voltage offset value.

2. The circuit of claim 1, wherein said sensing circuit is configured to sense a supply voltage for said circuit and wherein said nominal operating condition comprises a nominal supply voltage level.

3. The circuit of claim 2, further comprising a look-up table storing a plurality of values for gain offset, wherein each value of the plurality of values is associated with a measured gain drift that is correlated to supply voltage level.

4. The circuit of claim 1, wherein said sensing circuit is configured to sense a temperature of said circuit and wherein said nominal operating condition comprises a nominal operating temperature level.

5. The circuit of claim 4, further comprising a look-up table storing a plurality of values for gain offset, wherein each value of the plurality of values is associated with a measured gain drift that is correlated to operating temperature level.

6. The circuit of claim 1, further comprising storage circuitry configured to store a fixed gain offset value and a fixed voltage offset value which are set to provide compensation at said nominal operating condition, and wherein said control circuit is further operable to initially apply the fixed gain offset value as the gain offset value and initially apply the fixed voltage offset value as the voltage offset value.

7. A circuit, comprising:
a controllable gain element having a differential input and an output and operable to effect voltage offset compensation in response to a voltage offset value;
a differential shunt circuit coupled to the differential input of the controllable gain element;
a sensing circuit configured to sense a current operating condition of said circuit; and
a control circuit operable responsive to said sensed current operating condition to: detect that the current operating condition of the circuit is outside a nominal operating condition;
actuate the differential shunt to connect terminals of the differential input to each other; sense a voltage at the output of the controllable gain element; and apply the sensed voltage as said voltage offset value.

8. The circuit of claim 7, further comprising storage circuitry configured to store a fixed voltage offset value which is set to provide compensation at said nominal operating condition, and wherein said control circuit is further operable to initially apply the fixed voltage offset value as the voltage offset value.

9. A method, comprising:
effecting gain offset and voltage offset compensation for a controllable gain element having a differential input and an output in response to a gain offset value and voltage offset value;
sensing a current operating condition;
detecting that the current operating condition is outside a nominal operating condition; applying as said gain offset value a value selected as a function of the sensed current operating condition;
shunting terminals of the differential input to each other;
sensing a voltage at the output of the controllable gain element; and
applying the sensed voltage as said voltage offset value.

10. The method of claim 9, wherein detecting comprises:
sensing a supply voltage, said nominal operating condition comprising a nominal supply voltage level; and
determining that the sensed supply voltage differs from the nominal supply voltage level by more than a threshold; and
wherein applying comprises generating said gain offset as a function of the sensed supply voltage.

11. The method of claim 9, wherein detecting comprises:
sensing a temperature, said nominal operating condition comprising a nominal temperature level; and
determining that the sensed temperature differs from the nominal temperature voltage level by more than a threshold; and
wherein applying comprises generating said gain offset as a function of the sensed temperature.

12. The method of claim 9, further comprising:
storing a fixed gain offset value and a fixed voltage offset value which are set to provide compensation at said nominal operating condition;
initially applying the fixed gain offset value as the gain offset value; and
initially applying the fixed voltage offset value as the voltage offset value.

13. A method, comprising:
effecting voltage offset compensation for a controllable gain element having a differential input and an output in response to a voltage offset value;
sensing a current operating condition;
detecting that the current operating condition is outside a nominal operating condition;
shunting terminals of the differential input to each other;
sensing a voltage at the output of the controllable gain element; and
applying the sensed voltage as said voltage offset value.

* * * * *